(12) United States Patent
Masuda et al.

(10) Patent No.: US 8,093,672 B2
(45) Date of Patent: Jan. 10, 2012

(54) SOLID-STATE IMAGING DEVICE

(75) Inventors: Tomoki Masuda, Osaka (JP); Toshihiro Higuchi, Osaka (JP); Yasuo Takeuchi, Osaka (JP); Tomoko Komatsu, Kyoto (JP)

(73) Assignee: Panasonic Corporation, Osaka (JP)

( * ) Notice: Subject to any disclaimer, the term of this patent is extended or adjusted under 35 U.S.C. 154(b) by 278 days.

(21) Appl. No.: 11/523,698

(22) Filed: Sep. 20, 2006

(65) Prior Publication Data

US 2007/0096243 A1     May 3, 2007

(30) Foreign Application Priority Data

Oct. 28, 2005   (JP) .................................. 2005-314900

(51) Int. Cl.
*H01L 31/0232* (2006.01)
(52) U.S. Cl. .................. 257/432; 257/225; 257/226
(58) Field of Classification Search .................. 257/432, 257/81, 225, 228, 680
See application file for complete search history.

(56) References Cited

U.S. PATENT DOCUMENTS

| | | | |
|---|---|---|---|
| 5,773,323 A * | 6/1998 | Hur | 438/123 |
| 6,816,312 B2 * | 11/2004 | Oda et al. | 359/620 |
| 2002/0074628 A1 * | 6/2002 | Mochizuki | 257/666 |
| 2004/0002179 A1 | 1/2004 | Barton et al. | |
| 2004/0036069 A1 | 2/2004 | Barton et al. | |
| 2005/0212069 A1 * | 9/2005 | Sato et al. | 257/432 |
| 2005/0275746 A1 * | 12/2005 | Nishida et al. | 348/360 |
| 2006/0076636 A1 * | 4/2006 | Fukunaga | 257/432 |
| 2006/0103041 A1 * | 5/2006 | Su et al. | 264/2.5 |
| 2007/0057338 A1 * | 3/2007 | Lee et al. | 257/432 |
| 2007/0108578 A1 * | 5/2007 | Watanabe | 257/680 |

FOREIGN PATENT DOCUMENTS

| | | | |
|---|---|---|---|
| JP | 4-275459 A | 10/1992 | |
| JP | 5-55371 A | 3/1993 | |
| JP | 2002-176156 A | 6/2002 | |
| JP | 2004-031939 A | 1/2004 | |
| JP | 2005-223130 A | 8/2005 | |

* cited by examiner

*Primary Examiner* — Wai Sing Louie
*Assistant Examiner* — Tifney Skyles
(74) *Attorney, Agent, or Firm* — McDermott Will & Emery LLP

(57) ABSTRACT

Provided is a manufacturing method of a solid-state imaging device, which is able to realize a solid-state imaging device whose reflection prevention coating is even and that does not have image noise in case of adopting a spincoating method in applying a material of the reflection prevention coating onto microlenses of the solid-state imaging device. In the solid-state imaging device 1 according to the present invention, a barrier wall pattern 7 is formed, as a step alleviating structure, in dicing areas 5X formed between adjacent imaging areas 9. The barrier wall pattern 7 has a rectangular sectional form. With use of the barrier wall pattern 7 in the spincoating method, reflection prevention coating 8 is coated onto the microlenses 6 more evenly than in conventional cases.

11 Claims, 17 Drawing Sheets

SOLID-STATE IMAGING DEVICE

BACKGROUND OF THE INVENTION (1) Field of the Invention

The present invention relates to a solid-state imaging device, and in particular relates to an improvement for resolving application unevenness in forming reflection prevention coating on a microlens, and for improving a yield ratio.

(2) Related Art

A solid-state imaging device formed by providing a semiconductor substrate with a plurality of light receiving devices (e.g. photodiodes) has such excellent characteristics as being small, light, having long life, reduced afterimage, and low power consumption. Use of such solid-state imaging devices is becoming more and more frequent these days as light receiving devices for video cameras and digital still cameras.

As disclosed in Japanese Patent Application Publication No. 2005-223130 and Japanese Patent Application Publication No. 2002-176156 for example, one solid-state imaging device results after forming a plurality of solid-state imaging devices on one semiconductor substrate (i.e. wafer), and then dicing the solid-state imaging devices into respective chips. The size of each solid-state imaging device is becoming more and more minute. So as to perform light collection for the purpose of obtaining sufficiently high sensitivity, it is designed to provide each one of light receiving devices on a wafer with one microlens in the production process.

A microlens is formed widely by a transparent resin such as an acrylic resin and polystyrene. However these materials have a reflection rate of about 10%. So as to restrain such reflection, reflection prevention coating has been conventionally applied onto microlenses made of such materials.

The reflection prevention coating is for example formed by the LB (Langmuir-Blodgett) method as is explained in FIGS. 14-16 (see Japanese Patent Application Publication No. H4-275459 for detailed explanation). In FIGS. 14-16, a water tank 101 is prepared in which water 102 is contained. At the surface of the water 102 in the water tank 101, a monomolecular layer film 107 composed of a hydrophobic group 1071 and a hydrophilic group 1072 is provided by being pressured from the side by means of pully blocks 104-106 for the purpose of maintaining the solid state of the monomolecular layer film 107. Then the substrate P is immersed and emersed several times in to and from the water 102, there by depositing the monomolecular layer film 107 several times onto the substrate P, to complete the reflection prevention coating (composed of layers of M1, M2 and M3). Other methods such as a droplet surface casting method and a spincoating method may also be employed. The spincoating method is a method by which a reflection prevention coating material is dropped onto a wafer, and the wafer is rotated at a predetermined rotation speed so as to spread the reflection prevention coating material thin.

However, if the spincoating method is adopted to form reflection prevention coating, application unevenness tends to occur comparatively frequently. This is because in the spincoating method, a centrifugal force incurred at the spincoating basically acts along the surface of the wafer, and so it is difficult to realize uniform application of the reflection prevention coating through out the minute microlenses that protrude from the wafer surface.

To be more specific, a semiconductor substrate inherently has minute bumps corresponding to the form of the microlenses. Therefore the coating material applied throughout the wafer in a rapid speed by a spincoating method cannot reach the top of each lens. As a result, uneven coating thickness and application non-uniformness are occasionally caused for the microlenses to lead to generation of image noises. These problems are described in Japanese Patent Application Publication H4-275459, for example, and having been considered problems to be solved conventionally.

So as to counter these problems, Japanese Patent Application Publication No. H5-55371 (see FIG. 13) creates a rectangular dummy pattern at each intersection of dicing lines. The technology attempts to alleviate the problems of application unevenness by regulating the flow speed of the applied material onto the wafer surface during spincoating by using the dummy patterns as barrier walls (i.e. step alleviating structure) However the mentioned technology originally attempts to alleviate the application performance of the material directed to the wafer surface itself, and so is insufficient in terms of a means to alleviate application unevenness and non-uniform film coating with respect to the microlenses that protrude from the surface of the wafer.

In this way, in the current state of the art, there is still room left for improvement in the process of applying a coating material onto microlenses.

SUMMARY OF THE INVENTION

The present invention has been conceived in view of the stated problems, and has an object of providing a manufacturing method of a solid-state imaging device, which is able to realize a solid-state imaging device whose reflection prevention coating is uniform and without application unevenness and that does not have image noise, in case of adopting a spincoating method in applying a material of the reflection prevention coating onto microlenses of the solid-state imaging device.

So as to solve the stated problem, the present invention provides a solid-state imaging device including: a semiconductor substrate; a group of light receiving devices provided on a predetermined area of a surface of the semiconductor substrate, the predetermined area constituting an imaging area having four corners; a plurality of microlenses provided above the light receiving devices respectively; and at least one barrier wall pattern provided in at least part of a surrounding area of the imaging area, the part of the surrounding area corresponding to the four corners of the imaging area.

Here, the barrier wall pattern may be in a rectangular formation and is composed of one or more walls in a form of a rectangle.

Here, the barrier wall pattern may be in a round formation and is composed of one or more walls in a form of a round.

Here, a height of the barrier wall pattern in a direction of a thickness of the semiconductor substrate gradually may decrease as a distance from the imaging area increases.

Here, the barrier wall pattern may have a top portion formed as a slope whose height decreases gradually as distance from the imaging area increases in a plane direction of the semiconductor substrate.

Here, the barrier wall pattern may be composed of microlenses that are the same as the microlenses provided on the light receiving devices.

In addition, the present invention provides a method of manufacturing a solid-state imaging device, the method including: a barrier-wall-pattern forming step of forming a barrier wall pattern in a surrounding area of an imaging area, the imaging area being provided with microlenses and being formed above a semiconductor substrate; and a reflection-prevention-layer forming step of, after the barrier-wall-pattern forming step, forming a reflection prevention layer on a surface of the microlenses, where the barrier wall pattern is formed as a step alleviating structure, using a lithography method that uses a reduction projection optical system and a grayscale mask, a height of the barrier wall pattern being higher than a height of the imaging area in a thickness direction of the semiconductor substrate.

Here, the grayscale mask may be formed by printing an original on a transparent sheet as a gray pattern represented by crude density of black pixels, and then the printed original is copied onto a photograph sensitized material using a reduction projection optical system at a magnification such that each image of pixel of the original is blurred to be averaged with an image of adjacent pixels.

According to the stated structures of the present invention, in a resulting solid-state imaging device, at least one barrier wall pattern is provided in at least part of a surrounding area of the imaging area, the part of the surrounding area corresponding to the four corners of the imaging area. This structure prevents an application material applied onto a microlens from immediately flowing out, and enables a certain amount of the application material to be stored in the area surrounded by the barrier wall pattern.

Therefore, when the microlenses are subjected to a spin-coating method, the stored application material is made use of effectively, to prevent shortage of the application material, and to enable sufficient application material to be supplied up to the apexes of the microlenses belonging to a corresponding imaging area. As a result, the application material is evenly provided on the microlenses belonging to the imaging area, and an occurrence of problems such as iamge noises is able to be prevented.

Here, the present invention is characterized by providing a barrier wall pattern in an area surrounding the imaging area of a solid-state imaging device. Here "imaging area" indicates a collection of microlenses (hereinafter occasionally "microlens collection body"). In addition, "an area surrounding the imaging area" indicates an area between two adjacent microlens collection bodies.

It should noted here that the sectional form of a barrier wall pattern is not limited to a rectangular sectional form. In fact, the barrier wall pattern of the present invention may have a sectional form whose height changes either in a slope formation or in a step formation. In the case where the sectional form of the barrier wall pattern is either in a slope formation or in a step formation, it is necessary that the barrier wall pattern has a shortest height at a middle point between adjacent microlens collection bodies.

BRIEF DESCRIPTION OF THE DRAWINGS

These and other objects, advantages and features of the invention will become apparent from the following description thereof taken in conjunction with the accompanying drawings that illustrate a specific embodiment of the invention. In the drawings.

DESCRIPTION OF THE PREFERRED EMBODIMENTS

Embodiment

The following describes embodiments of the present invention. Note that needless to say, the present invention should not be limited to the specific examples stated in the following embodiments, and can be embodied by being modified as appropriate as long as such modification falls within the scope of the present invention.

First Embodiment

<Structure of Solid-State Imaging Device 1>

Figure 1:
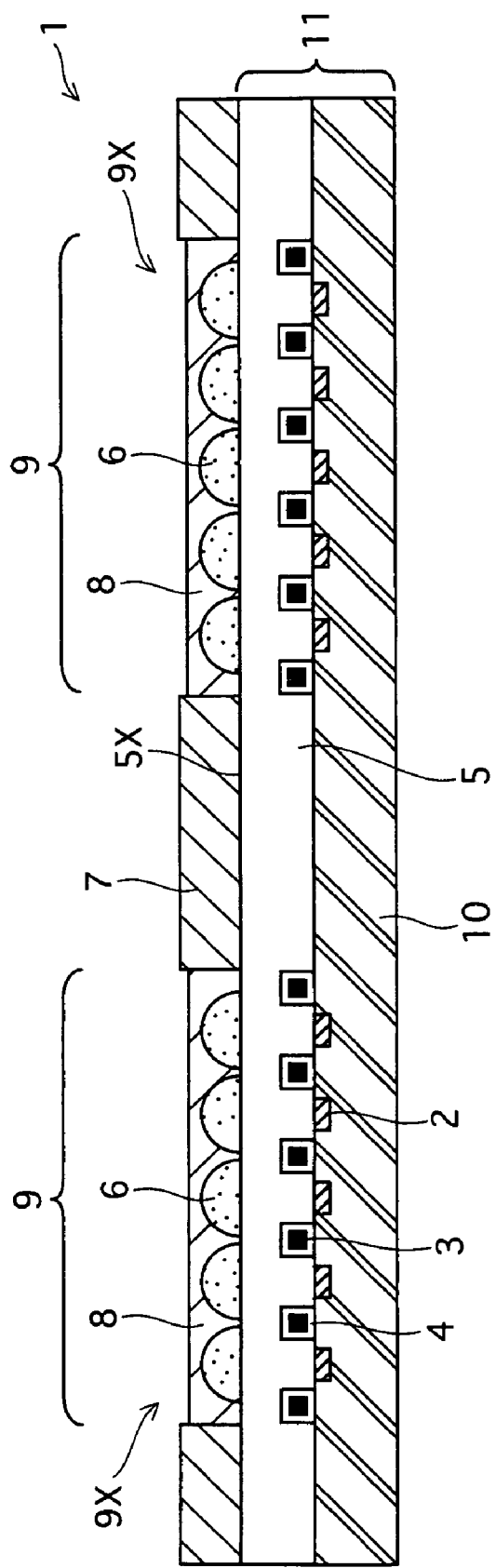
FIG. 1 is a sectional view showing a structure of a solid-state imaging device according to the first embodiment of the present invention.
Figure 2:
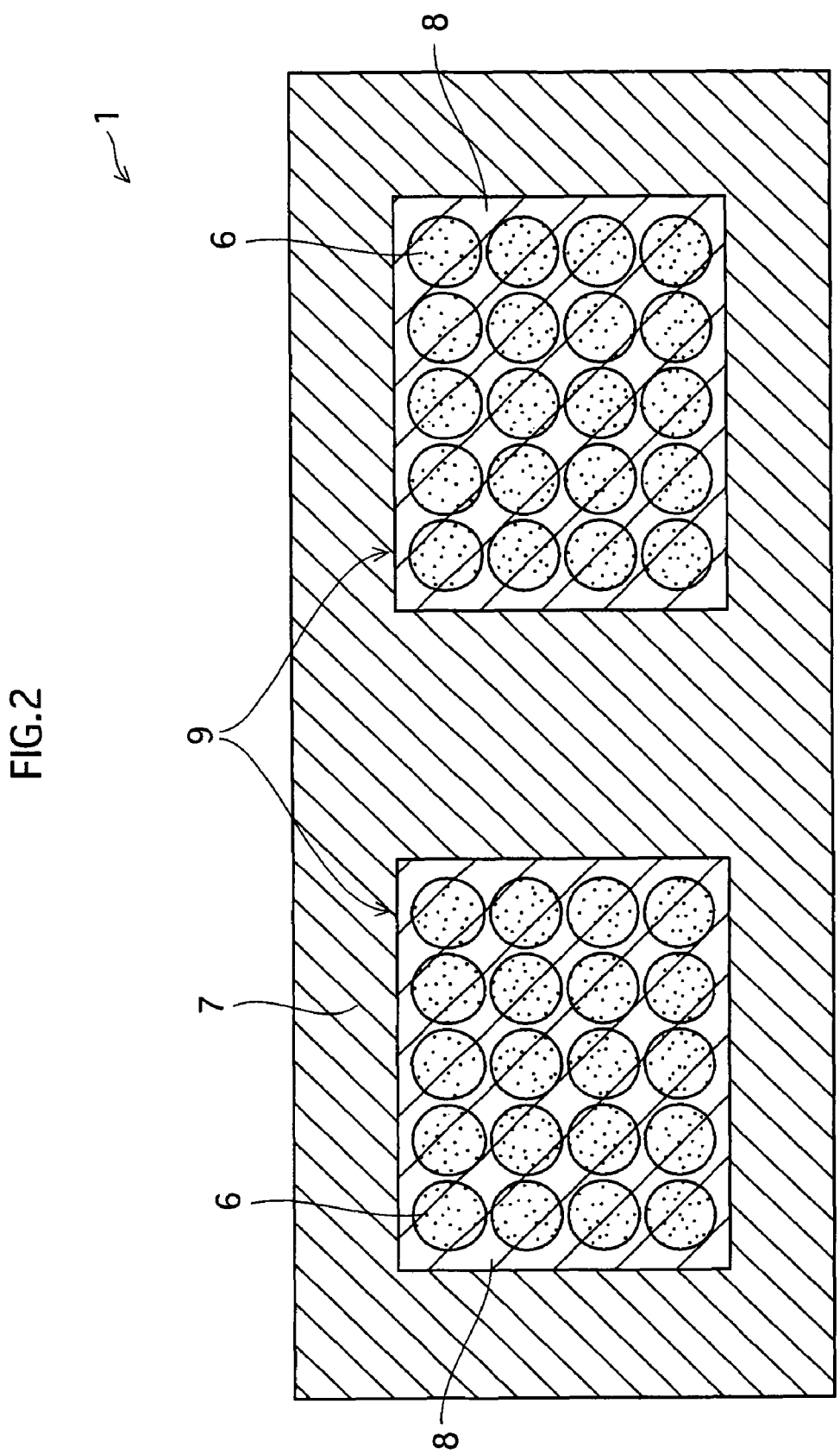
FIG. 2 is an upper plan view showing a structure of the solid-state imaging device according to the first embodiment of the present invention.

FIG. 1 is a schematic partially enlarged sectional diagram showing a solid-state imaging device 1 according to the first embodiment. FIG. 2 is a schematic partial plan view of the solid-state imaging device 1 viewed from above.

In the solid-state imaging device 1 illustrated in FIG. 1, on one surface of a substrate 10, a plurality of light receiving units 2 each made of a light receiving device (photodiode) are provided in a matrix formation. Transfer electrodes 3 are provided between the light receiving units 2 at a predetermined distance. Each transfer electrode 3 is covered by a light shielding insulation film 4, so that the metallic gloss of the transfer electrodes 3 will not obstruct the external light detecting performance of the light receiving units 2.

A flattening film 5 made of a transparent acrylic resin is formed on a whole surface of the substrate 10 so as to cover all of the light receiving units 2, the transfer electrodes 3, and the light shielding insulation films 4. As a result, the semiconductor substrate 11 (i.e. wafer) equipped with the flattening film 5 is formed.

In places of the surface of the flattening film 5 that correspond to the light receiving units 2, microlenses 6 made of an acrylic positive type photosensitive resin are formed.

As a result, in each solid-state imaging device 1, an imaging unit 9X constituted by a plurality of sets of one light receiving unit 2 and one microlens 6 arranged in a matrix formation is formed. When viewed from above the semiconductor substrate, the imaging unit 9X is recognized as an imaging area 9 being an area that corresponds to a collection of microlenses 6 ("microlens collection body"). In FIG. 2, the microlenses 6 of the imaging area 9 are arranged in a matrix formation when viewed from above. However in the present invention, the microlenses 6 may alternatively be arranged in a honeycomb formation or other formations, not limited to the mentioned matrix formation.

Here, a barrier wall pattern 7 is formed in a dicing area 5x that is created between adjacent imaging are as 9. The barrier wall pattern 7 functions as a dummy pattern that has a rectangular sectional form so as to surround each imaging area 9. This barrier wall pattern 7 constitutes a characteristic of the solid-state imaging device 1 of the first embodiment. Owing to this barrier wall pattern 7, the reflection prevention coating 8 is evenly applied throughout the microlenses 6 in the application process detailed below. This characteristic promotes favorable imaging performance.

The solid-state imaging device 1 is manufactured by undergoing a microlens forming step, a barrier-wall-pattern forming step, and a reflection-prevention-coating forming step, which are performed in the stated order.

Above each light receiving unit 2 provided on a surface of the substrate 10, a microlens is formed using acrylic positive type photosensitive resin (microlens forming step).

After this, a barrier wall pattern is formed in a surrounding area of the imaging area where the microlenses are provided (barrier-wall-pattern forming step).

An example of manufacturing the barrier wall pattern 7 is described as follows. First, a wafer provided with microlenses 6 on one surface thereof is prepared. On the surface of the wafer, about 3-5 cc of a positive type photosensitive material is dropped. Then, a spin coater is subjected to a main rotation at 1500-3000 rpm, to complete the barrier wall pattern 7.

Next, a solvent included in the dropped positive type photosensitive material (e.g. positive type photosensitive resist) is heated about 30-80 seconds at a temperature of 80-100 degrees Celsius, to be volatilized. Subsequent to this operation, the wafer is subjected to ultraviolet exposure and development, with use of a photomask having a pattern capable of shielding, from light, areas of the wafer except for each imaging area 9.

In the above description, note that "areas of the wafer except for each imaging area 9" includes each scribing position as well as each peripheral circuit.

As a result of the described process, a barrier wall pattern 7, in a rectangular sectional form, is formed in areas of the wafer except for each imaging area 9.

After this, a predetermined application material is applied onto the microlenses to form reflection prevention coating (reflection-prevention-coating forming substep).

<Advantageous Effect of the Application Process>

Next, the advantageous effect of the application process of the present invention is described. In addition, the consideration of application failure generated when the conventional technology is performed as follows.

Figure 18:
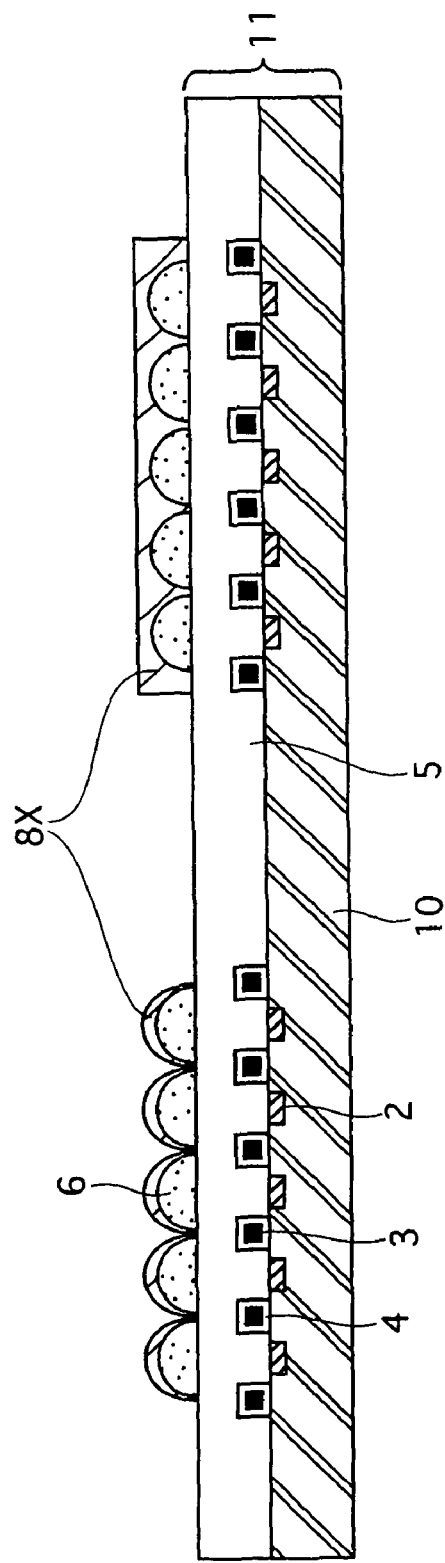
FIG. 18 is a diagram showing a conventional application manner directed to microlenses (being a sectional view)

FIG. 18 is a sectional view for explaining the manner of applying a material onto the microlenses 6. The left-hand side figure shows a case of uniform coating thickness, and the right-hand side figure shows a case where the surface is at least flat although the coating thickness is not uniform. On the other hand, FIG. 19 is a sectional view schematically showing a manner in which the application unevenness 8Y has been caused.

Figure 19:
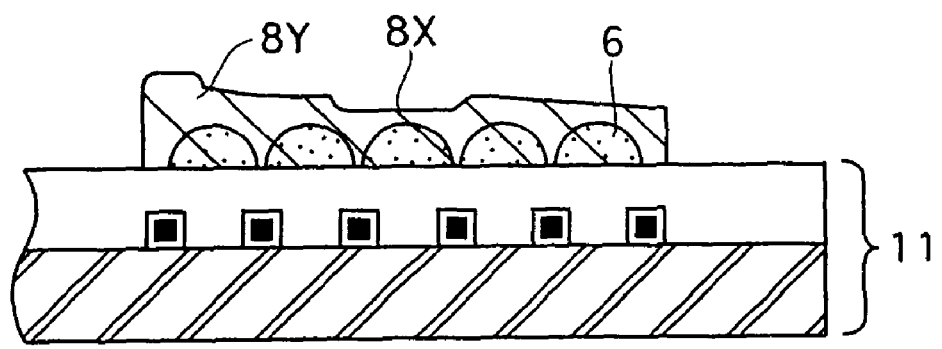
FIG. 19 is a schematic sectional view showing a manner in which application unevenness has occurred on the microlenses.

As shown in FIG. 19, when an application unevenness 8Y is caused while applying an application material 8X to the microlenses 6 during spincoating, this will lead eventually to roughness of the surface of the material covering the microlenses 6. When there is no application unevenness, it indicates a state that coating that has a flat surface is formed on the surfaces of the microlenses 6 as shown by the right-hand side figure of FIG. 18.

More concretely, "application unevenness" indicates a state in which the application material applied onto the microlenses 6 has unnecessary concaves/convexes and so is different in thickness. The concaves/convexes of the application material are concretely seen as grooves having a certain length.

Generally for a solid-state imaging device, due to such reasons as an entire thickness of the microlenses 6, the microlenses 6 have a height higher than the surface of the semiconductor substrate 11 by 0.5-2 μm. Therefore, the semiconductor substrate 11, as a whole, will have a plurality of grooves (i.e. concaves/convexes in sectional view). Even if the wafer (semiconductor substrate 11) is spinned according to the normal spincoating method, the centrifugal force caused by the spinning will only have an effect along the wafer surface. As a result, above the microlenses 6, the level of spread of the application material is different from part to part.

More specifically, the structure of a microlens is such that the lower portion of has a large surface area, and the surface area becomes smaller as closer to the apex of the microlens. Therefore, in one microlens, the range of spread of the application material made possible in the same time range during spincoating is different between the lower portion and the upper portion of the microlens. This means that even when an application material is favorably provided for the lower portion of a microlens, it is hard to realize a uniform thickness of the application material up to the apex of the microlens under the same condition.

Due to the above-stated principle, if an application material simply dropped onto the wafer is used in spincoating directed to the entire microlenses, favorable provision of the application material up to the apex of each microlense is not possible. In addition, application unevenness and non-uniform coating thickness will be caused. These problems will eventually lead to deterioration in image characteristics of a solid-state imaging device, which specifically is unintended lines appeared in a display image (so-called image noise").

In view of this, the first embodiment is designed to surround the peripheral portion of each imaging area 9 with the barrier wall pattern 7. Here, it is desirable to set the height of the barrier wall pattern 7 higher than the height of the microlenses 6 contained in the imaging area 9, so as to alleviate such problems as the application unevennenss.

Note that "peripheral portion" is an area that excludes where the microlenses 6 are concentrated, and that includes an OB unit, a pad, and a dicing (scribing) position and each peripheral circuit other than the microlenses 6.

According to the present invention, the advantageous effect is obtained by spincoating in the following manner:

1. When the application material is dropped onto the surface of the wafer, the dropped application material is first stored in the barrier wall pattern 7. As a result, in the immediate vicinity of the microlenses 6 within the barrier wall pattern 7, an amount of application material sufficient for reaching the apexes of the microlenses 6 is stored.
2. After this, when the wafer is spinned, the centrifugal force is exercised onto the stored application material along the wafer plane surface, to move the application material in the horizontal direction, thereby lifting the material up to the apexes of the microlenses 6. Owing to this structure, even by means of the conventional spincoating method, the application material is favorably spread throughout the entire surfaces of the microlenses 6, substantially regardless of the form of the microlenses 6.
3. Due to the above-stated principle, the material application is favorably pursued throughout the entire surfaces of the microlenses 6 evenly.

Note that for achieving the lift-up effect of the application material by favorably storing the application material, the height of the barrier wall pattern 7 should be desirably the same as the height of the microlenses 6 or higher.

In addition, in the above-described first embodiment, the application material applied on the microlenses 6 is a positive type photosensitive material. However, the present invention is not limited to this, and the similar structure may be formed by adopting a negative type resist if a light shielding area is adequately selected by means of photomasks.

Second and Third Embodiments

Figure 3:
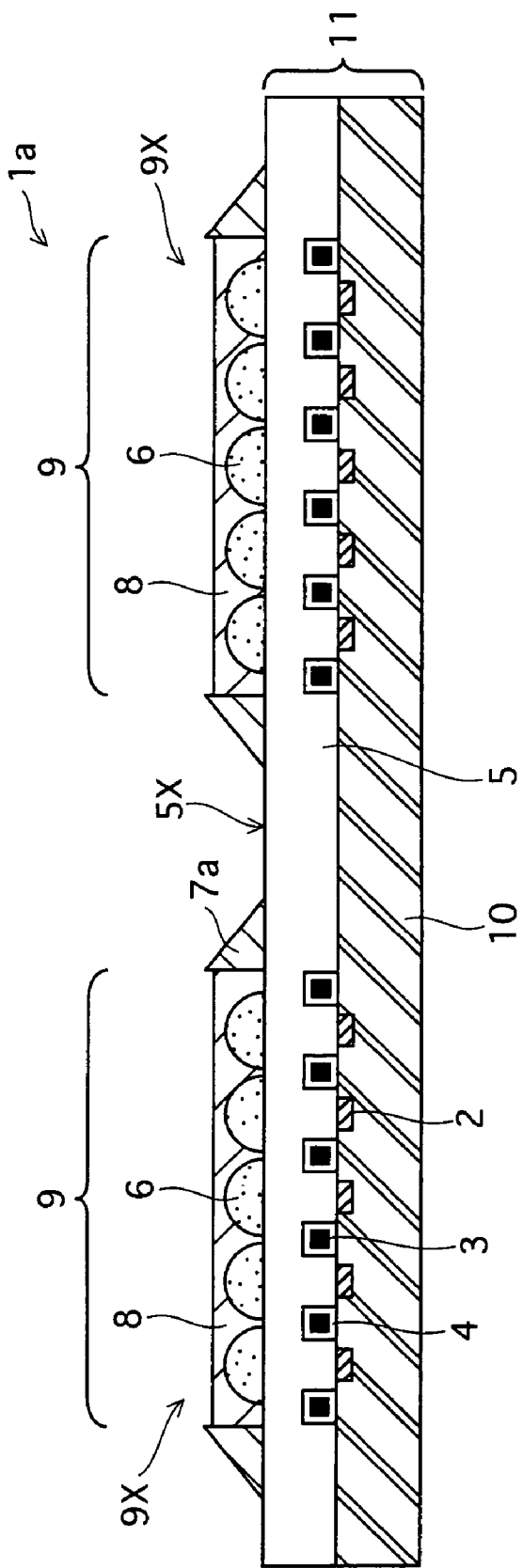
FIG. 3 is a sectional view showing a structure of a solid-state imaging device according to the second embodiment of the present invention.
Figure 4:
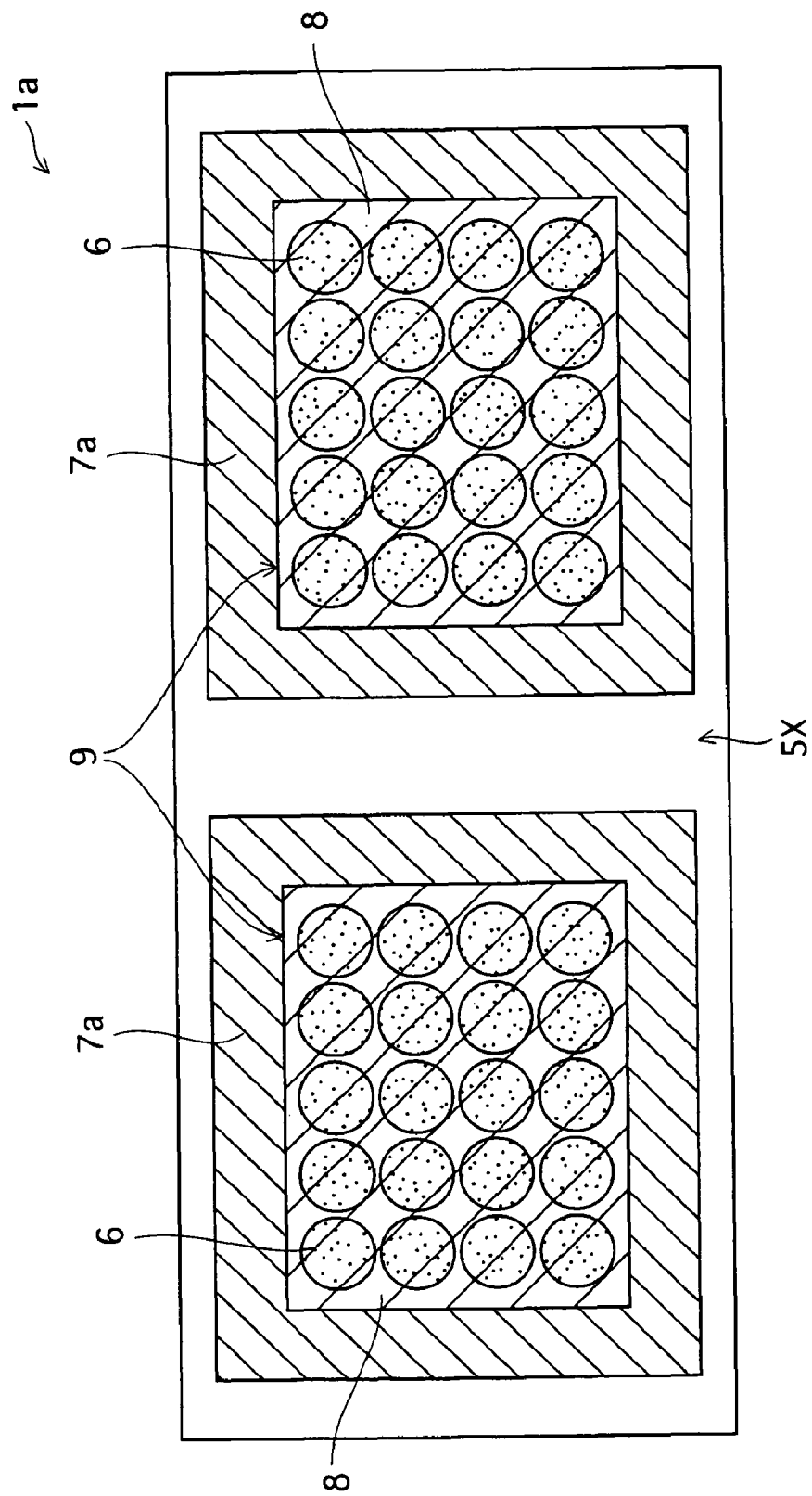
FIG. 4 is an upper plan view showing a structure of the solid-state imaging device according to the second embodiment of the present invention.

As follows, the second embodiment is described by mainly focusing on the difference with the first embodiment. FIGS. 3 and 4 are respectively a sectional view and an upper plan view of a solid-state imaging device 1a regarding the second embodiment.

The characteristic of the solid-state imaging device 1a is that, as shown in FIG. 3, the sectional form of the barrier pattern 7a that surrounds each imaging area 9 is set to be a form of a substantial right-angled triangle, whose height of the slope is set to be decremented in the direction as a distance from a corresponding imaging area 9 increases. In addition, the barrier wall pattern 7a is not formed with respect to the dicing area 5x. The height of the barrier wall pattern 7a is set as the same as the counterpart in the first embodiment.

The barrier wall pattern 7a is made of the same photosensitive material as is used in the first embodiment. However, for forming the slope, a grayscale mask whose transparency rate is in the range of 0% to 100% inclusive and whose transparency distribution is continuous is used.

To be more specific, a so-called photolithography method is used to provide a photosensitive material in every area excluding the microlenses 6, and exposure is performed via a grayscale mask whose transparency rate is regulated by an opening area ratio of the minute pattern. In this way, successful exposure of the photosensitive material in the exposure amount continually changed with the transparency rate lying in the range of 0% to 100% inclusive is realized. As a reuslt, the barrier wall pattern 7a, which has a slope, is formed. The angle of the slope is freely controllable by regulating the transparency rate of the grayscale mask in advance. The thickness regulation of the photosensitive material is easily performed in accordance with the viscosity and the solvent type of the application material.

The grayscale mask is manufacturable in the following way. First, on a transparent sheet, for example, an original is printed as a gray pattern represented by crude density of black pixels. The printed original is then copied onto a photograph sensitized material using a reduction projection optical system at a magnification such that each image of pixel of the original is blurred to the extent not resoluble by being mixed with the image of adjacent pixels. As a result, the grayscale mask will be complete.

The solid-state imaging device 1a according to the second embodiment, having the stated structure, also achieves the advantageous effect of realizing application with little application unevenness. In addition, the described solid-state imaging device 1a also achieves an advantageous effect of requiring a smaller amount of a material for forming the barrier wall pattern, because the barrier wall pattern 7a having the right-angled triangle sectional form has a smaller volume than the barrier wall pattern 7 having the rectangular sectional form.

Figure 5:
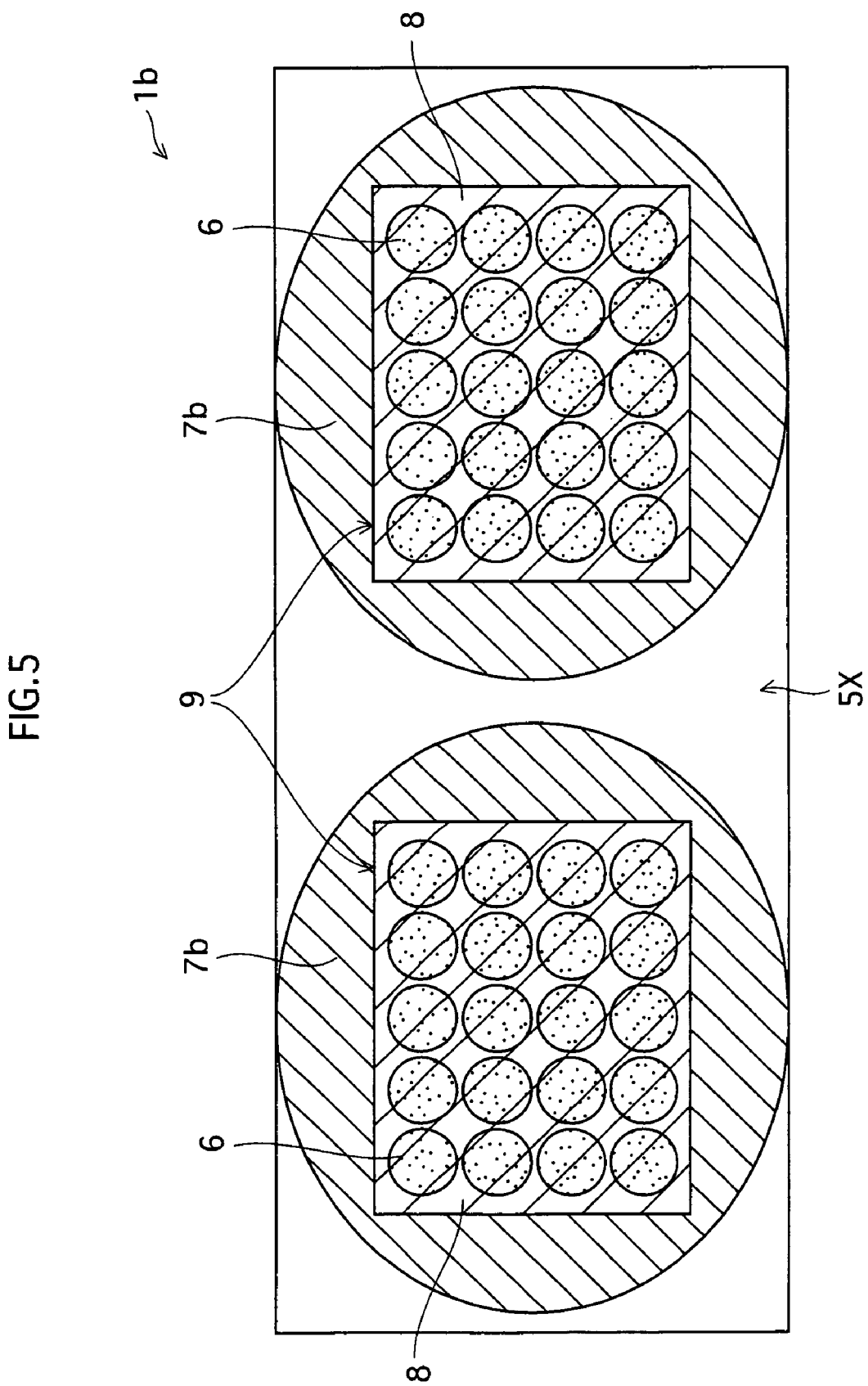
FIG. 5 is a sectional view showing a structure of a solid-state imaging device according to the third embodiment of the present invention.

Note that in the solid-state imaging device 1a according to the second embodiment, the barrier wall pattern 7a has a rectangular form viewed from above. However, the present invention is not limited to this, and the following third embodiment is also possible. FIG. 5 shows a solid-state imaging device 1b according to the third embodiment of the present invention. As shown in FIG. 5, a barrier wall pattern 7b of the solid-state imaging device 1b has a round form or an oval form viewed from above. If the barrier wall pattern has a form that does not have any angle in a plan view, application material residual flows away rapidly in the dicing area 5X during spincoating, so as to facilitate collection thereof favorably. As a result, improvement in application efficiency is expected.

Fourth and Fifth Embodiments

Figure 6:
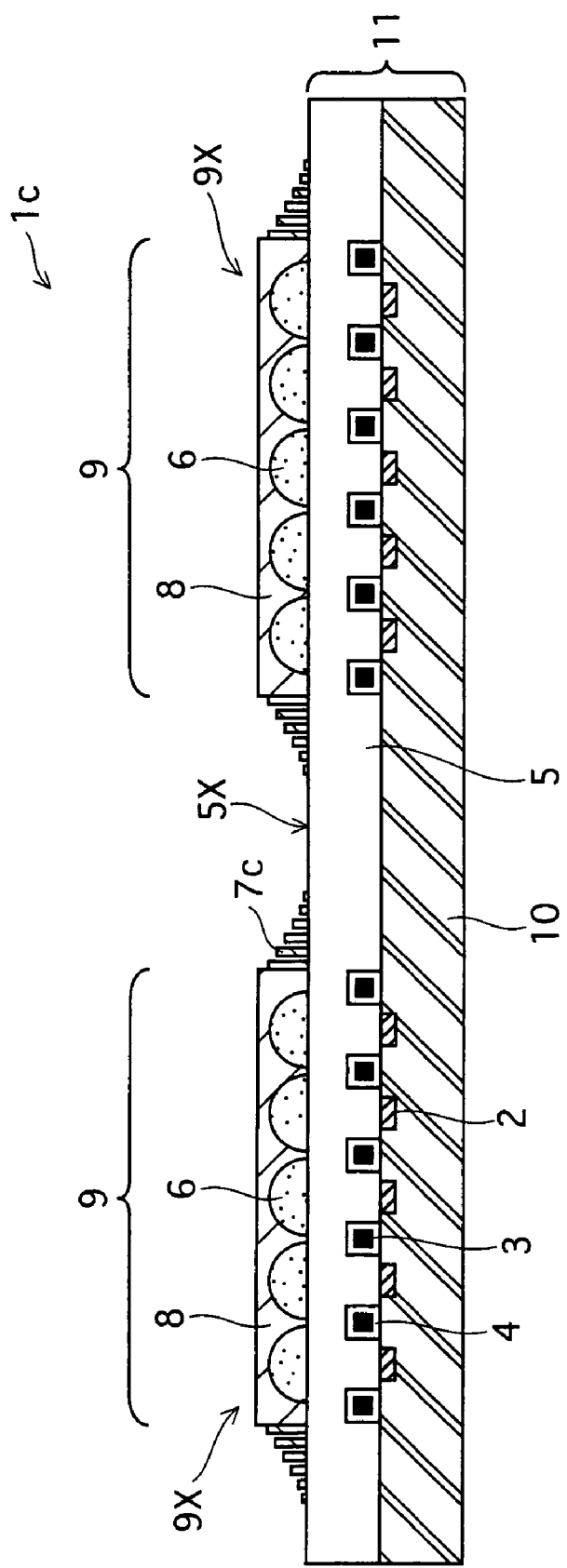
FIG. 6 is a sectional view showing a structure of a solid-state imaging device according to the fourth embodiment of the present invention.
Figure 7:
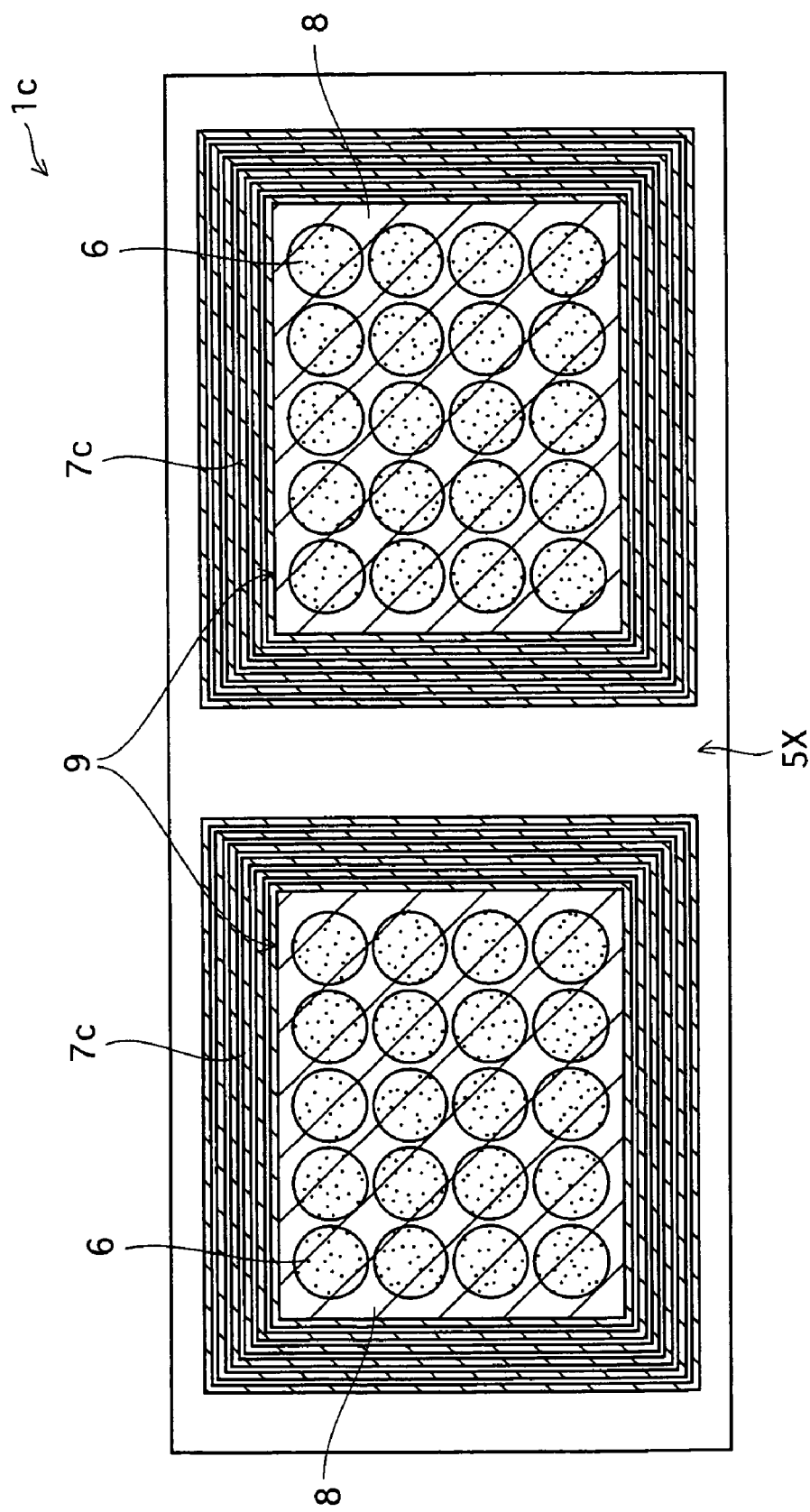
FIG. 7 is an upper plan view showing a structure of the solid-state imaging device according to the fourth embodiment of the present invention.

As follows, the fourth embodiment is described by mainly focusing on its characteristic points. FIGS. 6 and 7 are respectively a sectional view and an upper plan view of a solid-state imaging device 1c regarding the fourth embodiment.

The solid-state imaging device 1c according to the fourth embodiment is created based on the second embodiment. The characteristic of the solid-state imaging device 1c is that its barrier wall pattern 7c is formed by arranging several ring-form members each having a narrow width with a predetermined distance between each other. The ring-form members get lower in height as a distance from a corresponding imaging area 9 increases.

The solid-state imaging device 1c according to the fourth embodiment, having the barrier wall pattern 7c, also achieves substantially the same advantageous effects as those of the second embodiment. In addition, when the application material flowing in a radial formation from the center of the surface of the substrate flows into imaging areas 9, the speed and amount thereof is regulated by the ring-form members, and so an advantageous effect of restricting the application material from spattering and the like is expected too.

Figure 8:
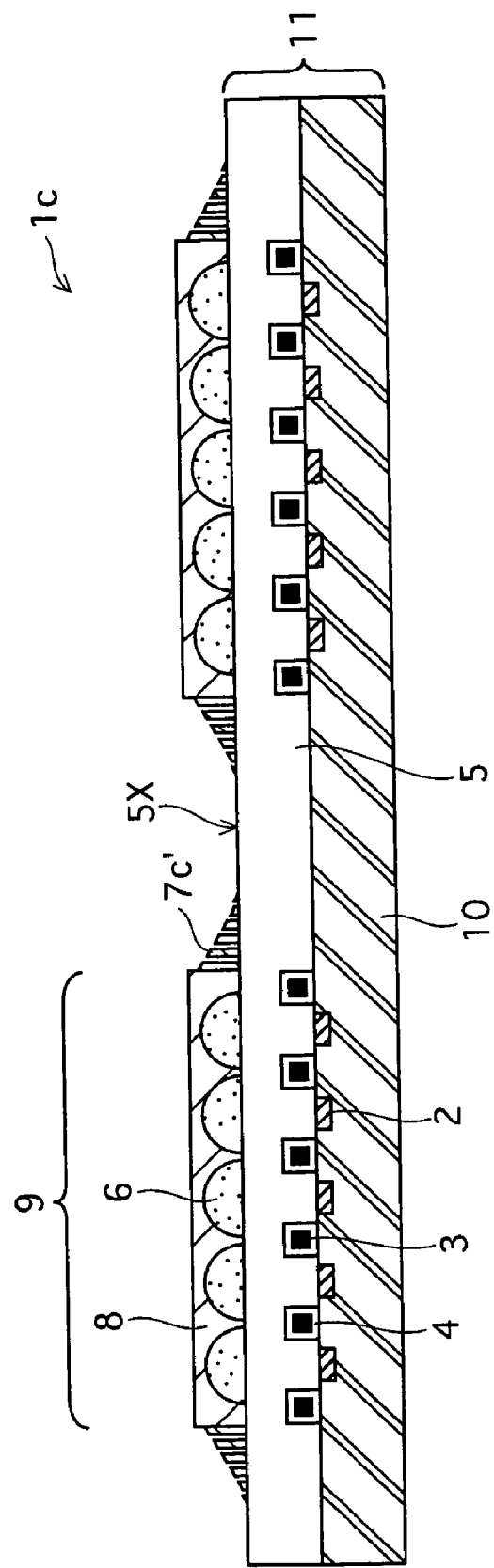
FIG. 8 is a sectional view showing a structure of a solid-state imaging device according to the fourth embodiment of the present invention.

Note that it is also possible that each ring-form member of the barrier wall pattern 7c may have a top portion formed as a slope whose height decreases gradually as a distance from a corresponding imaging area increases in the direction of the wafer plane. FIG. 8 illustrates this modification example (barrier wall pattern 7c'). The barrier wall pattern 7c' is also formed with a smaller amount of a material and so is advantageous, just as in the second and third embodiment.

Figure 9:
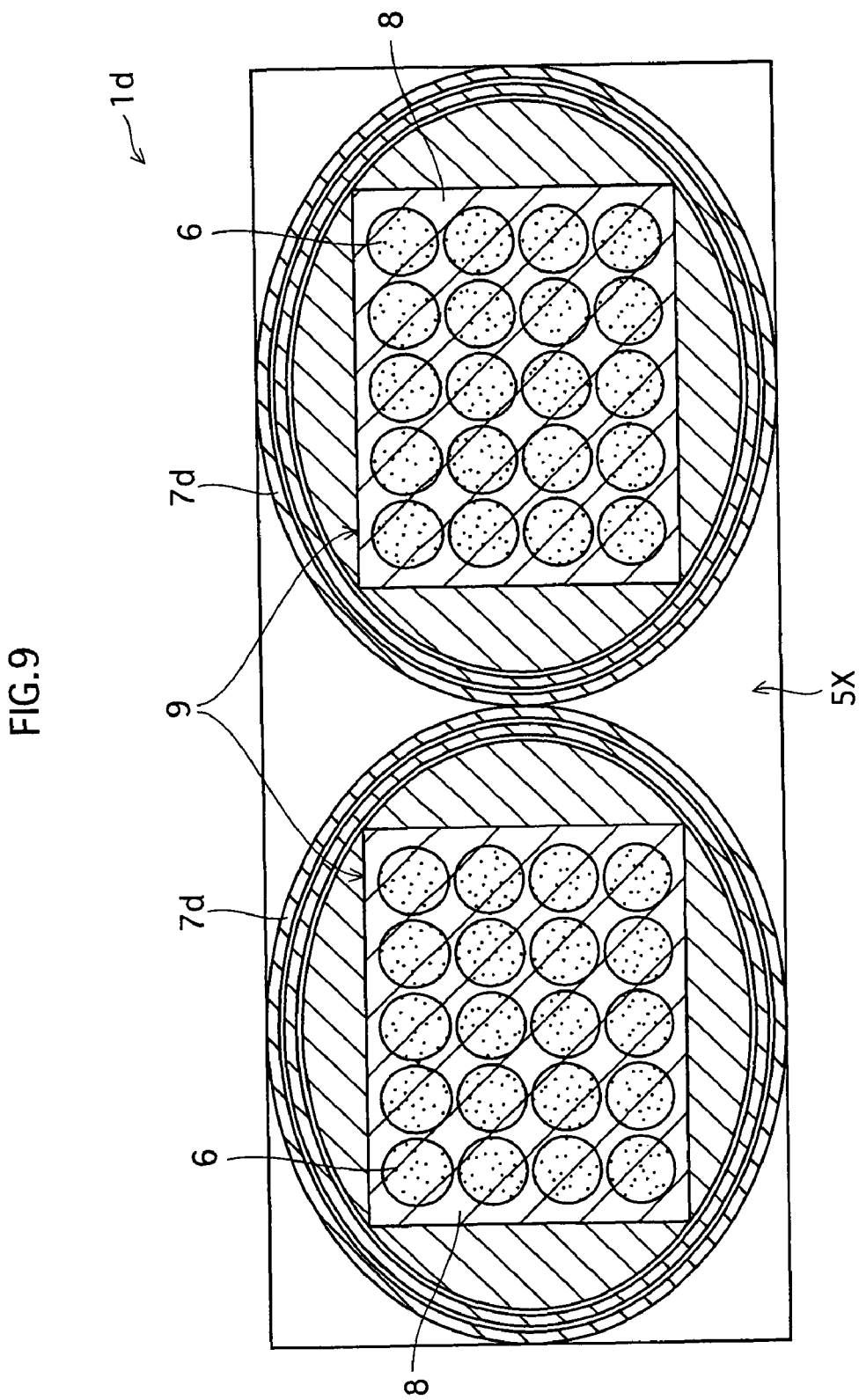
FIG. 9 is an upper plan view showing a structure of the solid-state imaging device according to the fifth embodiment of the present invention.

In addition, in the forth embodiment, the barrier wall pattern 7c has a rectangular form viewed from above. However the present invention is not limited to this, and the following fifth embodiment is also possible. FIG. 9 shows a solid-state imaging device 1d according to the fifth embodiment of the present invention. As shown in FIG. 9, a barrier wall pattern 7d of the solid-state imaging device 1d has a round form or an oval form viewed from above. If the barrier wall pattern has a form that does not have any angle in a plan view as in the third embodiment, application material residual flows away rapidly in the dicing area 5X from the wafer surface, so as to facilitate collection thereof favorably. As a result, improvement in application efficiency is expected.

Sixth Embodiment

Figure 10:
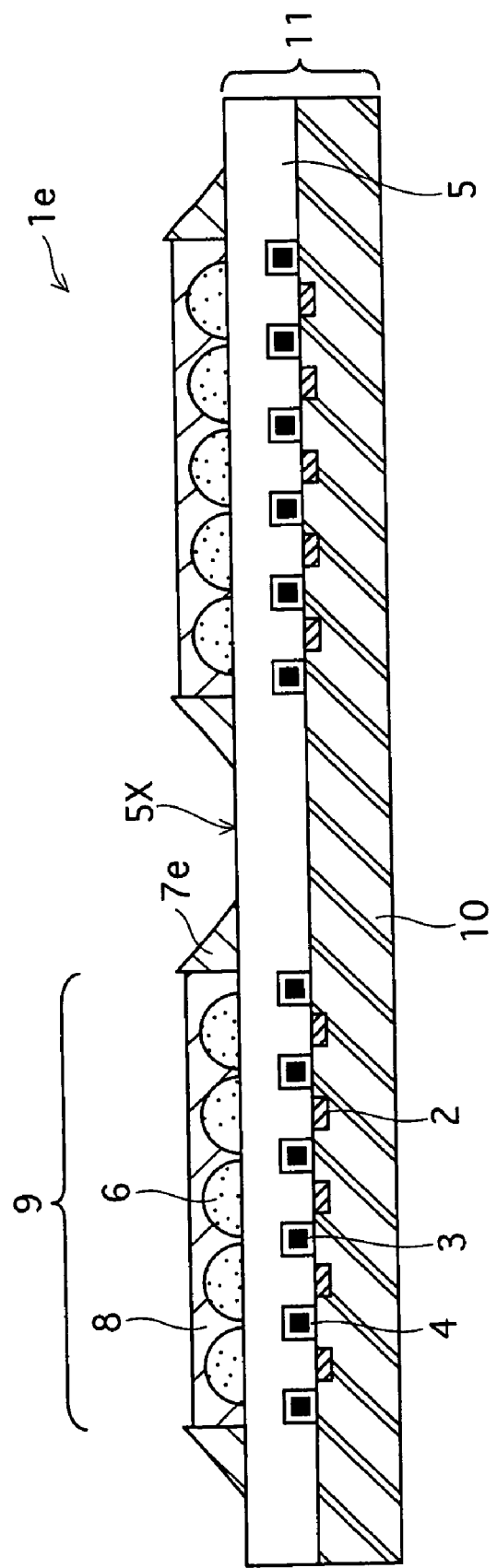
FIG. 10 is a sectional view showing a structure of a solid-state imaging device according to the sixth embodiment of the present invention.
Figure 11:
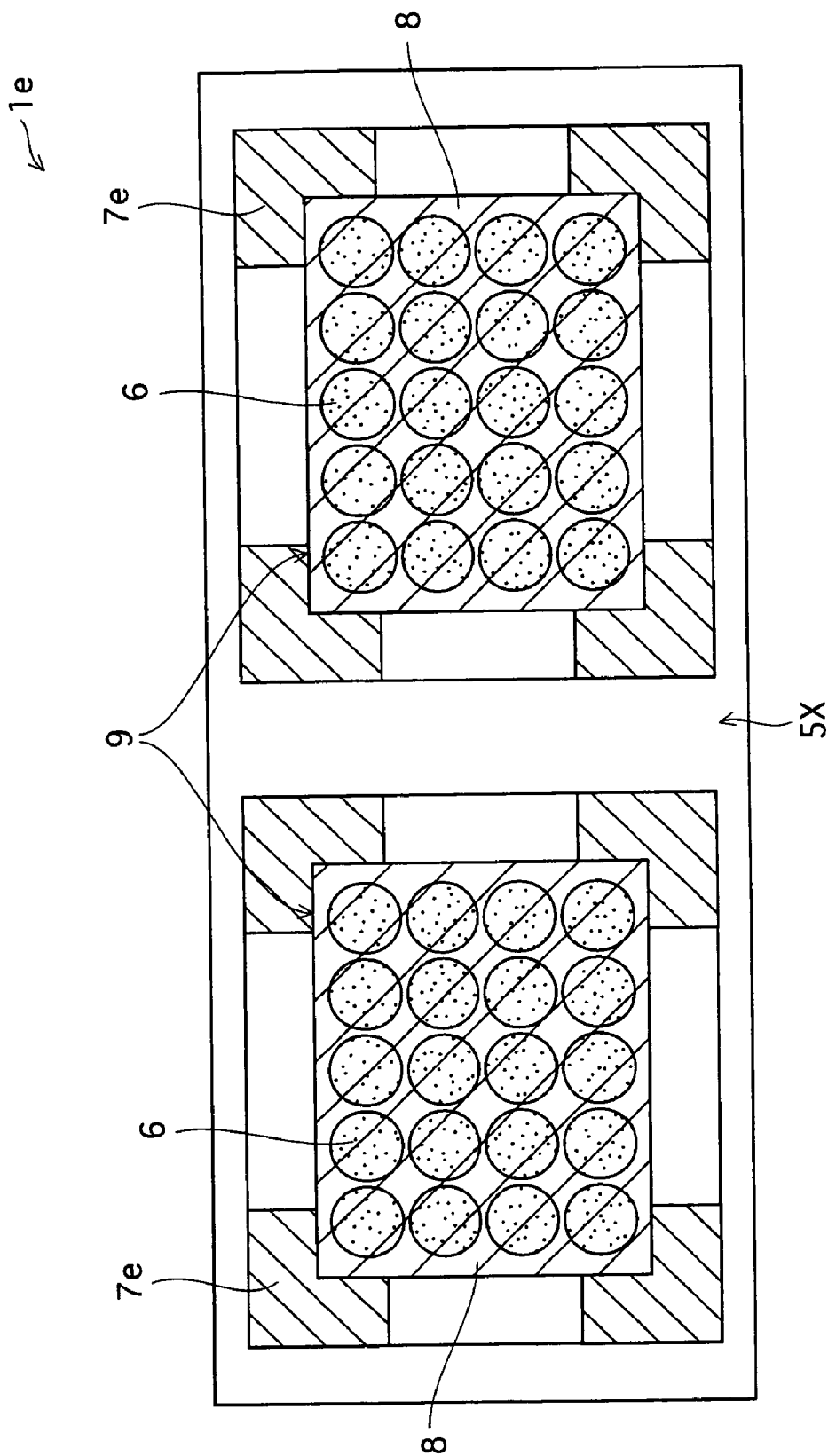
FIG. 11 is an upper plan view showing a structure of the solid-state imaging device according to the sixth embodiment of the present invention.

As follows, the sixth embodiment is described by mainly focusing on its characteristic points. FIGS. 10 and 11 are respectively a sectional view and an upper plan view of a solid-state imaging device 1e regarding the sixth embodiment.

The solid-state imaging device 1e according to the sixth embodiment is created based on the second embodiment. The characteristic of the solid-state imaging device 1e is that its barrier wall pattern 7e is constituted by only four portions respectively provided in position corresponding to the four corners of the rectangular imaging area 9. The barrier wall pattern 7e is made of a photosensitive material, and is manufactured by making use of the grayscale mask as is adopted in the second embodiment.

The solid-state imaging device 1e according to the sixth embodiment, having the stated structure, also achieves substantially the same advantageous effect of realizing application with little application unevenness. In addition to this, the following advantageous effects are also expected.

In case where the viscosity of the application material is high for example, the dropped application material tends not to spread rapidly with use of the spincoating method. Therefore, even if the solid-state imaging device 1e has such a barrier wall pattern 7e, it is still possible to store the application material within the imaging area 9 to some extent.

In addition, a microlens collection body is normally formed in a rectangular formation, and so one of the angular portions of the microlens collection body should be closer to the center of the wafer. Here, the application unevenness is due to the unevenness of the material supply which is mainly attributable to the form of the microlenses at this angular portion closest to the center of the wafer. Therefore so as to alleviate the application unevenness, it becomes necessary to provide a partial slope in the vicinity of this angular portion. However in the sixth embodiment, the barrier wall pattern 7e has a slope just as in the second embodiment, and so is expected to achieve the effect of lifting the application material from the lowest position of the wafer surface up to the apexes of the microlenses 6 along the slope of the barrier wall pattern 7e. According to this advantageous effect, the application unevenness in the vicinity of the four corners of an imaging area 9 is expected to be alleviated.

Furthermore, during spincoating, the application material tends to be concentrated at the four corners of the imaging area 9 in a rectangular formation. Therefore if at least the application material is assuredly supported at the four corners of the imaging area 9, it is expected to lift up the application material up to the apexes of the microlenses 6, to achieve substantially through application.

It should be noted here that just as in the first embodiment, the height of the barrier wall pattern 7e is desirably the same as the height of the microlenses 6 or higher.

Seventh Embodiment

Figure 12:
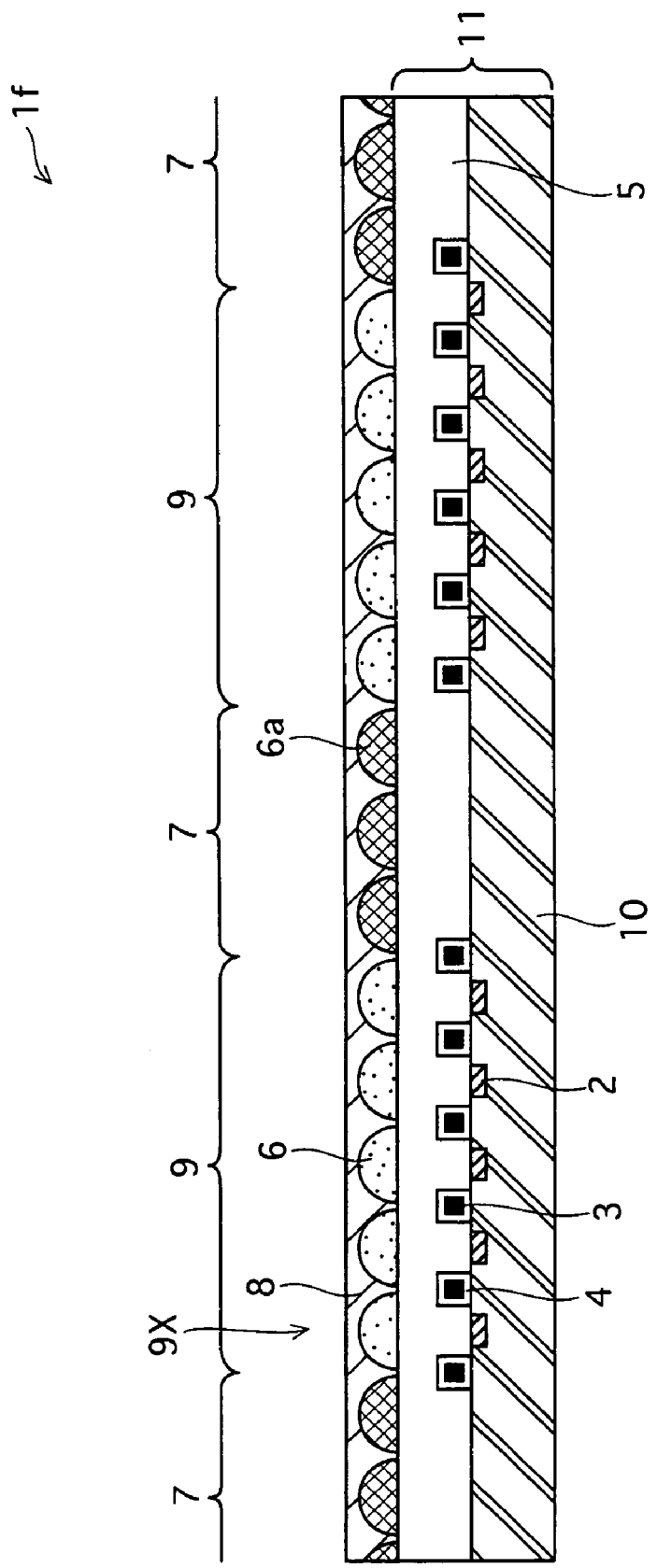
FIG. 12 is a sectional view showing a structure of a solid-state imaging device according to the seventh embodiment of the present invention.
Figure 13:
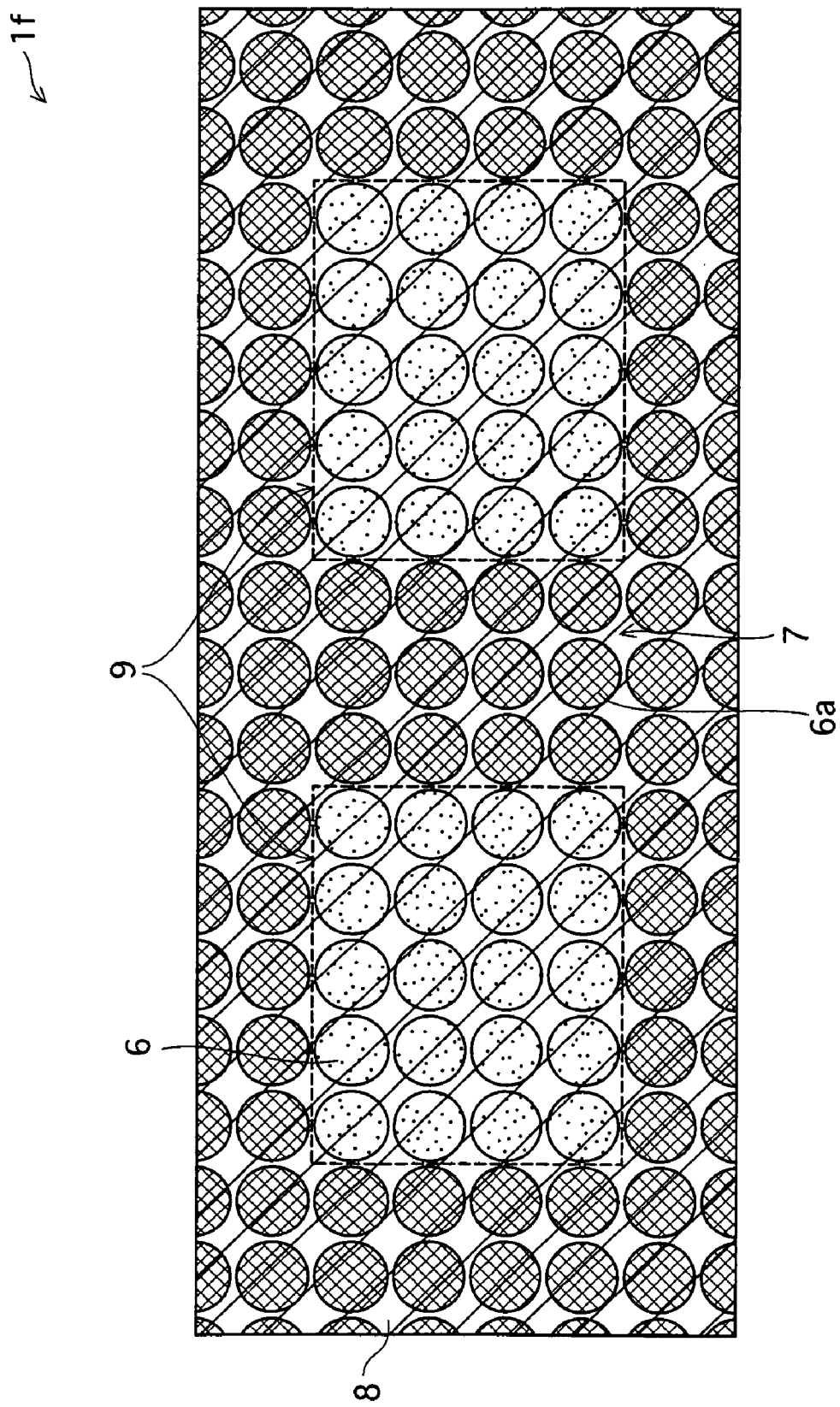
FIG. 13 is an upper plan view showing a structure of the solid-state imaging device according to the seventh embodiment of the present invention.
Figure 14:
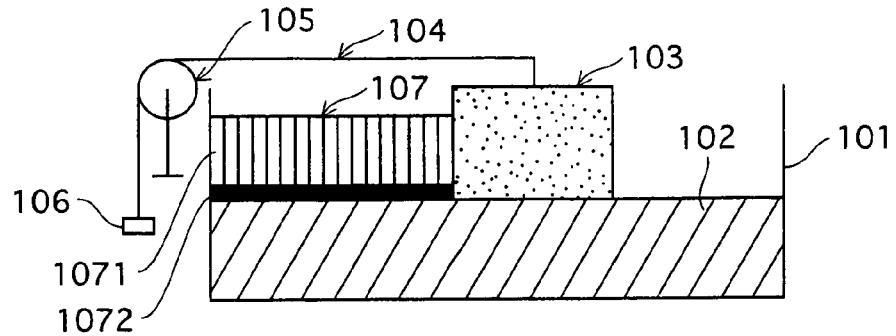
FIG. 14 is a schematic view showing a coating forming overview according to the LB (Langmuir-Blodgett) method.
Figure 15:
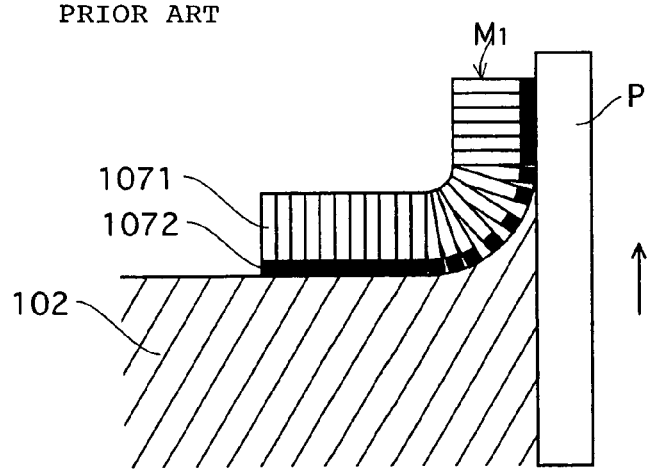
FIG. 15 is a schematic view showing the coating forming overview according to the LB method.
Figure 16:
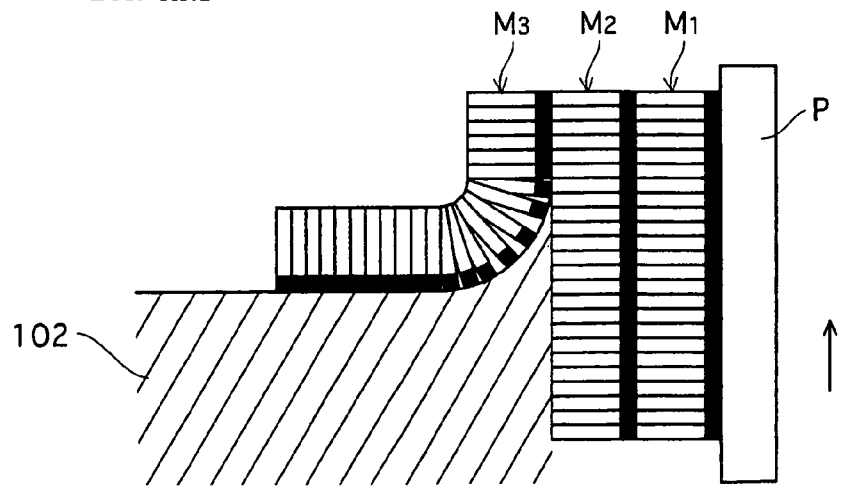
FIG. 16 is a schematic view showing the coating forming overview according to the LB method.
Figure 17:
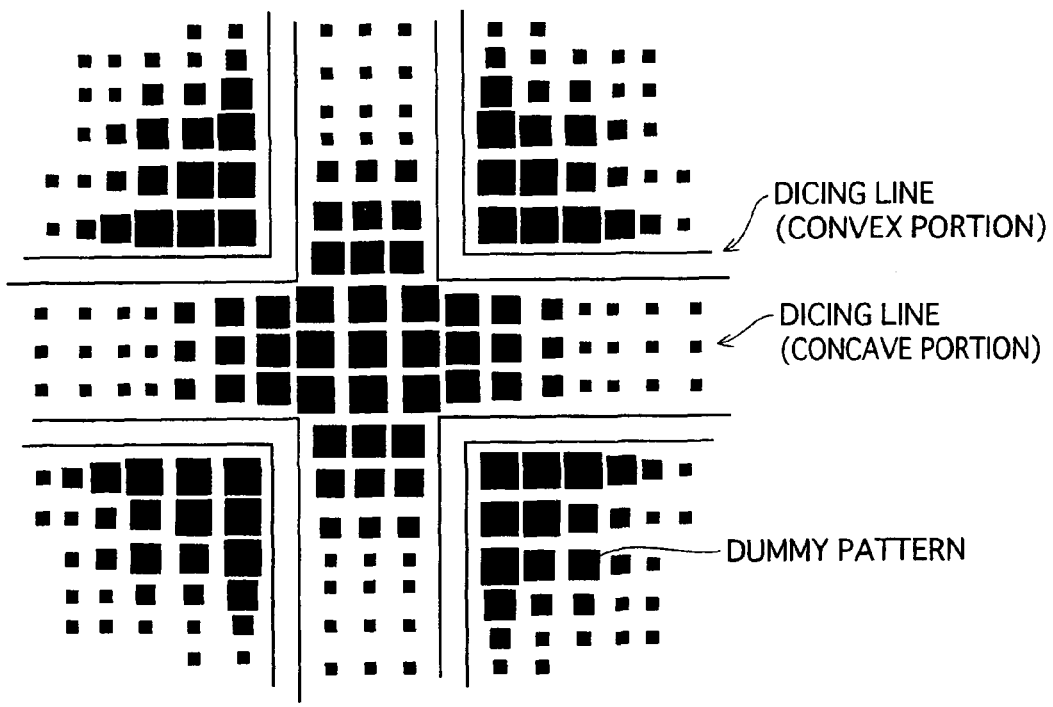
FIG. 17 is an upper plan view showing a solid-state imaging device whose barrier wall pattern exhibits a conventional formation.

FIG. 12 is a sectional view of a solid-state imaging device if regarding the seventh embodiment, and FIG. 13 is an upper plan view of the solid-state imaging device 1f.

The characteristic of the solid-state imaging device 1f according to the seventh embodiment is that microlenses are provided throughout the entire surface of the wafer, and part of the microlenses that is positioned in the dicing area is set as dummy lenses 6a. Imaging areas 9 are arranged in a matrix formation just as in the first embodiment. Note that in FIGS. 12 and 13, microlenses 6 and microlenses 6a are illustrated as distinguishable, but are not distinguishable in appearance, in reality.

According to the mentioned structure, the application material dropped onto the surface of the wafer during the spincoating is evenly spread throughout the entire area of the wafer surface, and so the microlenses 6 and the microlenses 6a have the identical application condition. As a result, the application unevenness caused on the microlenses 6 and the microlenses 6a is restrained. There fore the seventh embodiment is considered as having a favorable structure in pursuing the application of the application material to the microlenses 6 evenly.

(Other Things to be Noted)

Note that in the present invention, the main purpose of the barrier wall pattern has been described to be of use in application of an application material to the microlenses 6. However, some wafer process conventionally uses the similar type of barrier wall pattern as a dummy pattern for other purposes. The present invention may be realized by using such a dummy pattern as the barrier wall pattern. If such a structure is adopted, it is more advantageous because of being reasonable and of contributing to manufacturing cost reduction, compared to a case of forming two different dummy patterns.

Concretely, in stead of a conventionally and widely used hollow center package structure, a direct attachment structure may be used where a translucent adhesive is used to directly attach a translucent plate material to a semiconductor substrate provided with a light receiving unit and a floating dispersion unit. In such a direct attachment structure, a dummy pattern is occasionally used at as a weir portion, to prevent adhesives from being attached. In such a case, the dummy pattern for preventing attachment of adhesives may be also used as a barrier wall pattern of the present invention.

Although the present invention has been fully described byway of examples with references to the accompanying drawings, it is to be noted that various changes and modifications will be apparent to those skilled in the art. Therefore, unless otherwise such changes and modifications depart from the scope of the present invention, they should be construed as being included therein.

What is claimed is:

1. A solid-state imaging device comprising:
a semiconductor substrate;
a group of light receiving devices provided on a surface of the semiconductor substrate;
an imaging area provided relative to the group of light receiving devices;
a plurality of microlenses provided above the light receiving devices respectively; and
at least one barrier wall pattern provided in at least part of a surrounding area of the imaging area, wherein the barrier wall pattern is made of an organic material, a reflection prevention coating is provided over the microlenses and within a peripheral portion of the image area, the barrier wall pattern has a first surface facing the semiconductor substrate, a second surface opposite the first surface, and a third surface adjacent to the first surface and second surface, and the reflection prevention coating is in direct contact with the third surface.

2. The solid-state imaging device of claim 1, wherein the barrier wall pattern is in a rectangular formation and is composed of one or more walls in a form of a rectangle.

3. The solid-state imaging device of claim 1, wherein a top of the second surface of the barrier wall pattern is higher than a top of each of the microlenses.

4. The solid-state imaging device of claim 1, wherein the organic material is made from a photosensitive material.

5. A solid-state imaging device comprising:
a semiconductor substrate;
a group of light receiving devices provided on a surface of the semiconductor substrate;
an imaging area relative to the group of light receiving devices;
a plurality of microlenses provided above the light receiving devices respectively; and
at least one barrier wall pattern provided in at least part of a surrounding area of the imaging area,
wherein the barrier wall pattern has a first surface facing the semiconductor substrate, a second surface opposite the first surface, and a third surface adjacent to the first surface and second surface; and
a coating provided over the microlenses such that the coating is in direct contact with the third surface of the barrier wall pattern.

6. The solid-state imaging device of claim 1, wherein the third surface of the barrier wall pattern is perpendicular to the first surface of the barrier wall pattern.

7. The solid-state imaging device of claim 1, wherein the reflection prevention coating is in contact with the microlenses.

8. The solid-state imaging device of claim 5, wherein the third surface of the barrier wall pattern is perpendicular to the first surface of the barrier wall pattern.

9. The solid-state imaging device of claim 5, wherein the coating is in contact with the microlenses.

10. The solid-state imaging device of claim 1, wherein the imaging area has four corners, and
the barrier wall pattern is provided in the part of the surrounding area corresponding to the four corners of the imaging area.

11. The solid-state imaging device of claim 5, wherein the imaging area has four corners, and
the barrier wall pattern is provided in the part of the surrounding area corresponding to the four corners of the imaging area.

* * * * *